(12) United States Patent
Tusan et al.

(10) Patent No.: US 6,320,759 B1
(45) Date of Patent: Nov. 20, 2001

(54) PRINTED CIRCUIT BOARD ADAPTER

(75) Inventors: Robert D. Tusan, Laguna Niguel; Thomas A. Herrington, Lake Forest; Jerry Arreola, Santa Ana, all of CA (US)

(73) Assignee: ADC DSL Systems, Inc., Minneapolis, MN (US)

( * ) Notice: Subject to any disclaimer, the term of this patent is extended or adjusted under 35 U.S.C. 154(b) by 0 days.

(21) Appl. No.: 09/383,505

(22) Filed: Aug. 24, 1999

Related U.S. Application Data

(63) Continuation-in-part of application No. 08/916,306, filed on Aug. 22, 1997, now abandoned.

(51) Int. Cl.[7] ............................................ H05K 7/14
(52) U.S. Cl. ..................... 361/801; 361/796; 361/825; 211/41.17; 206/706
(58) Field of Search ........................... 361/796, 801, 361/802, 731, 732, 740, 741, 747, 756, 759, 825; 439/377; 211/41.17; 206/706

(56) References Cited

U.S. PATENT DOCUMENTS

| | | | |
|---|---|---|---|
| 3,631,299 | * 12/1971 | Meyer et al. | ............................ 361/752 |
| 4,694,380 | * 9/1987 | Mallory et al. | ........................ 361/816 |
| 5,481,434 | * 1/1996 | Banakis et al. | ........................ 361/756 |

* cited by examiner

*Primary Examiner*—Jayprakash N. Gandhi
(74) *Attorney, Agent, or Firm*—Frank C. Price

(57) ABSTRACT

A plastic, one-piece adapter for a printed circuit board (PCB) holds the PCB within a recessed area by means of a series of fixed, overhanging tabs and a series of snap latches, all of which are integrally molded as part of the one-piece adapter.

2 Claims, 4 Drawing Sheets

PRINTED CIRCUIT BOARD ADAPTER

CONTINUATION-IN-PART for Ser. No. 08/916,306 filed Aug. 22, 1997 which is hereby abandoned.

Referenced U.S. patents

U.S. Pat. No. 4,694,380 Mallory et al Sep. 19, 1987

U.S. Pat. No. 3,631,299 Meyer Dec. 28, 1971

BRIEF SUMMARY OF THE INVENTION

The invention is a molded plastic, one-piece, open-faced adapter with an indented area to hold a printed circuit board (PCB).

The PCB is located within the indented area which is recessed by an amount equal to the thickness of the PCB. The PCB is located within the recess by pins which align with holes in the PCB. The PCB is held in place under a series of fixed overhanging tabs along one edge of the PCB and under a series of molded snap latches along the opposite edge of the PCB.

Meyer has invented a two-piece, enclosing, protective holder for a PCB. The two pieces have male and female posts for their joining and for locating the PCB within the enclosure.

Mallory has invented a metal plate with attached plastic edge rails to hold a PCB. Locating posts, locking fingers and receiving slots are formed in the plastic rails.

DETAILED DESCRIPTION

Figure 1:
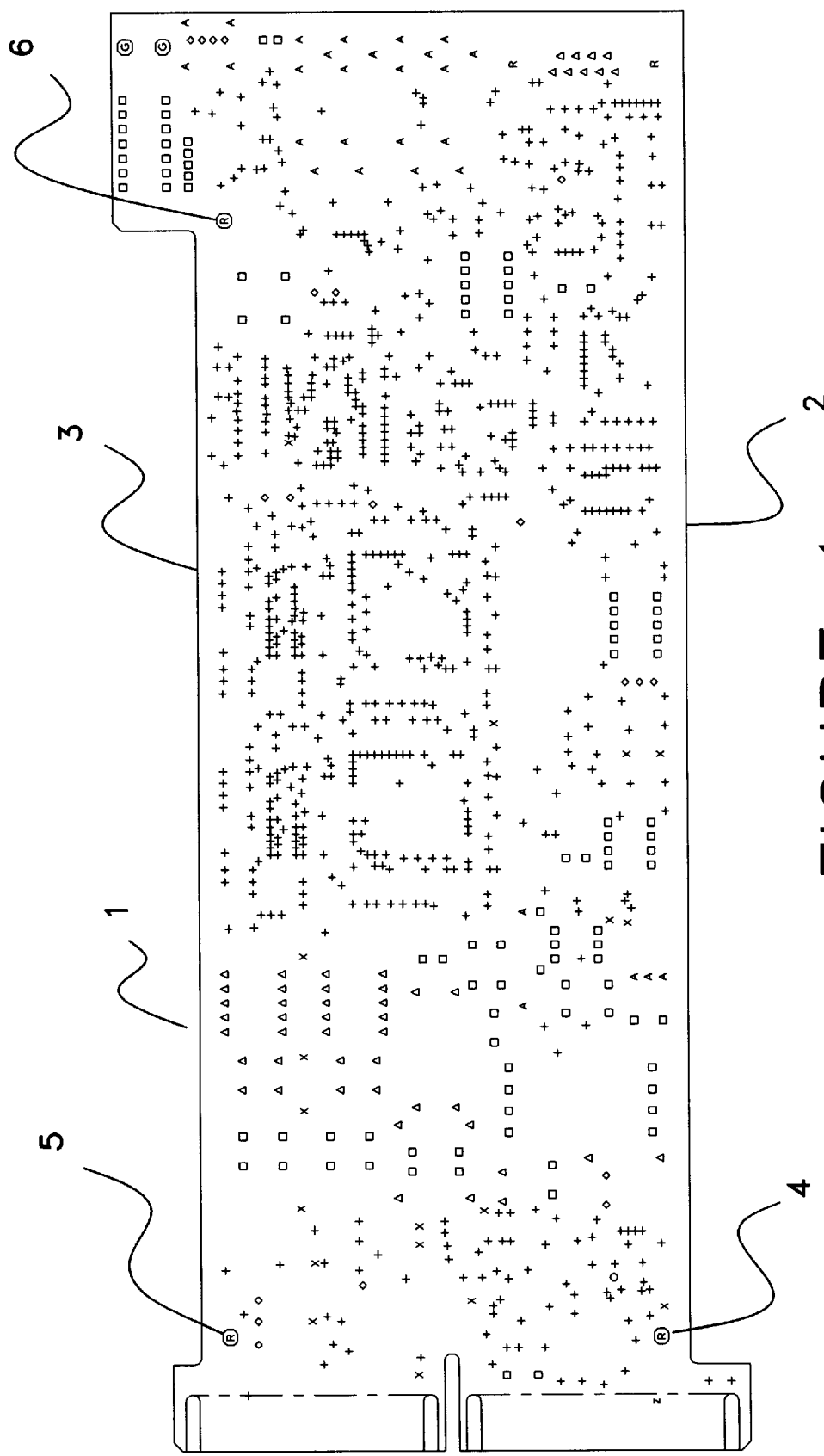
FIG. 1 shows a side view of an example PCB, its outline shape, and three alignment holes that would locate it into the adapter upon its installation.

In FIG. 1 is shown a blank PCB 1 with its lower edge 2 and its upper edge 3 and three alignment holes 4, 5 and 6 all of which serve to locate it onto the invention.

Figure 2:
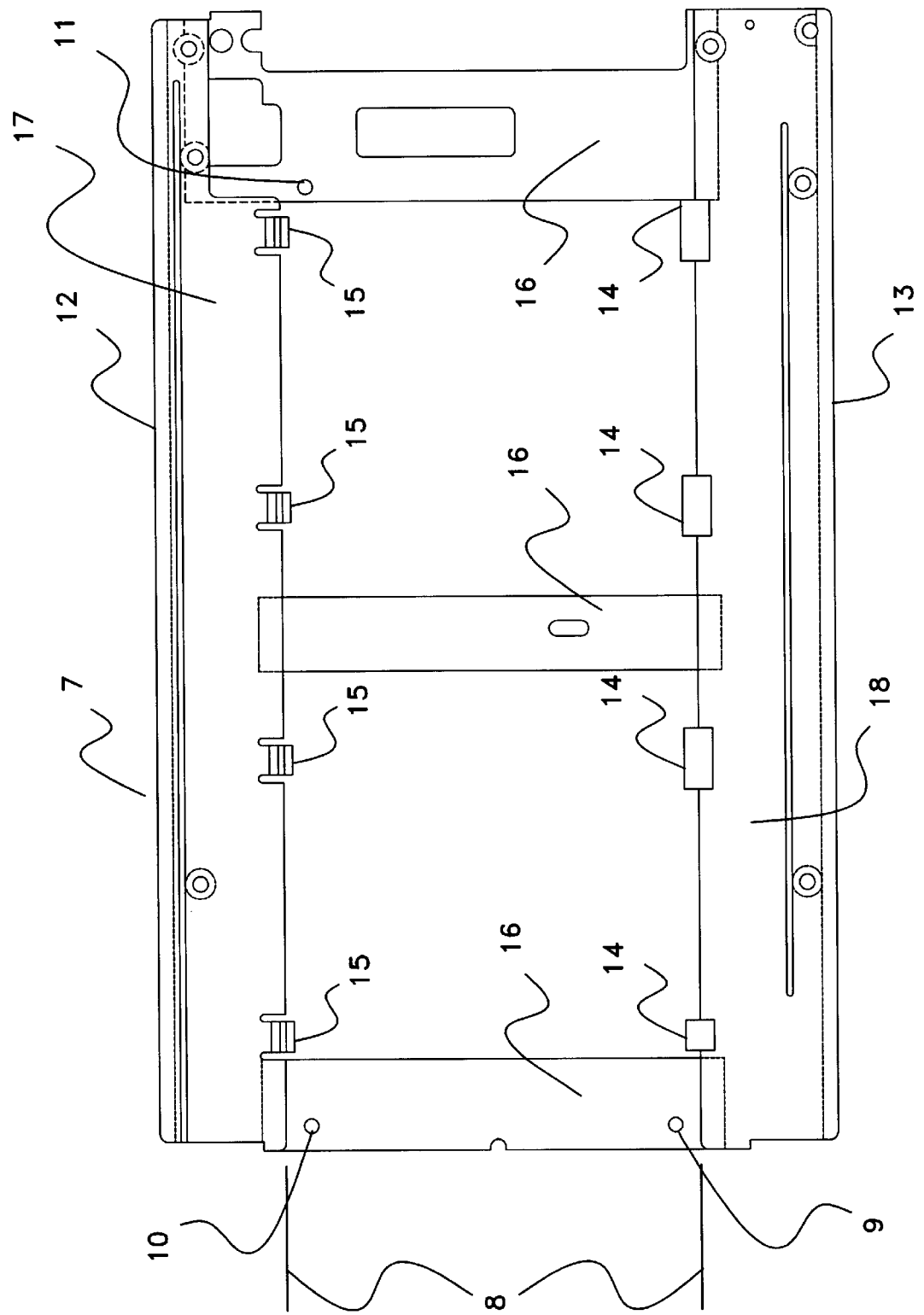
FIG. 2 shows a side view of the adapter with its features for receiving the example PCB.

In FIG. 2 is shown the subject invention, an adapter 7, upon which a PCB, not shown, of a given size 8 can be mounted. The dimension 8 defines the width of a PCB which can be mounted on the adapter 7. Pins 9, 10 and 11 mate with the holes 4, 5 and 6 in a mounted PCB such as shown in FIG. 1. This accurately In FIG. 2 is shown the subject invention, an adapter 7, upon which a PCB, not shown, of a given size 8 can be mounted. The dimension 8 defines the width of a PCB which can be mounted on the adapter 7 in the recessed area formed between both the snap latches 15 along one edge and the cantilevered tabs 14 along the other edge and the surface of the connecting webs 16. Pins 9, 10 and 11 mate with the holes 4, 5 and 6 in a mounted PCB. In FIG. 1 is seen a typical PCB that can be mounted. This accurately locates the edges of a PCB of width 8 relative to the upper and lower edges 12 and 13 of the adapter 7. The four fixed retaining surfaces, shown as cantilevered tabs 14, and the four snap latches 15, better seen in FIG. 3, along with webs 16, form a recessed area and hold the PCB 1 of FIG. 1 into the recessed area. In this preferred embodiment the adapter, of open design, is made up of three webs 16 holding the top and bottom strips 17 and 18 in proper position and orientation relative to each other. Almost any arrangement of webs could be used. Those details on FIG. 2 that are not called out are typical formations for molded parts, but are not pertinent to the invention.

Figure 3:
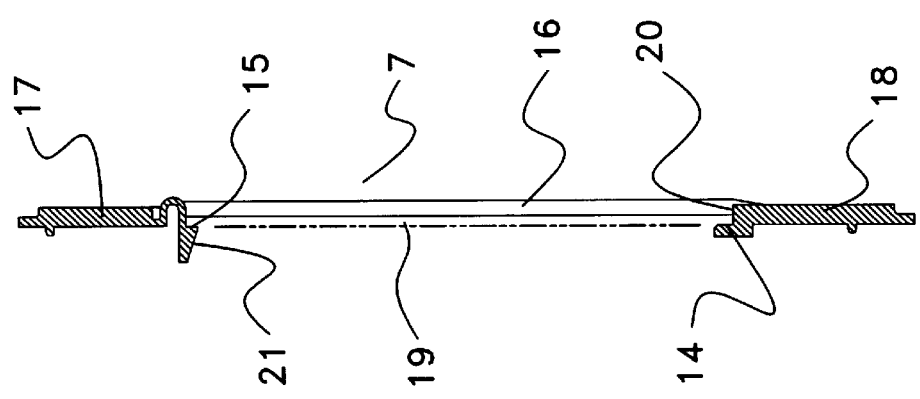
FIG. 3 is an end cross sectional view of the adapter.

FIG. 3 shows mounting points on the adapter 7 for a PCB. Dimension 19 represents the thickness of a PCB. The lower edge of the PCB rests at surface 20 and its upper edge snaps under the snap latch 15 via the snap latch ramp 21 that is typical of four snap latches on the invention.

Figure 4:
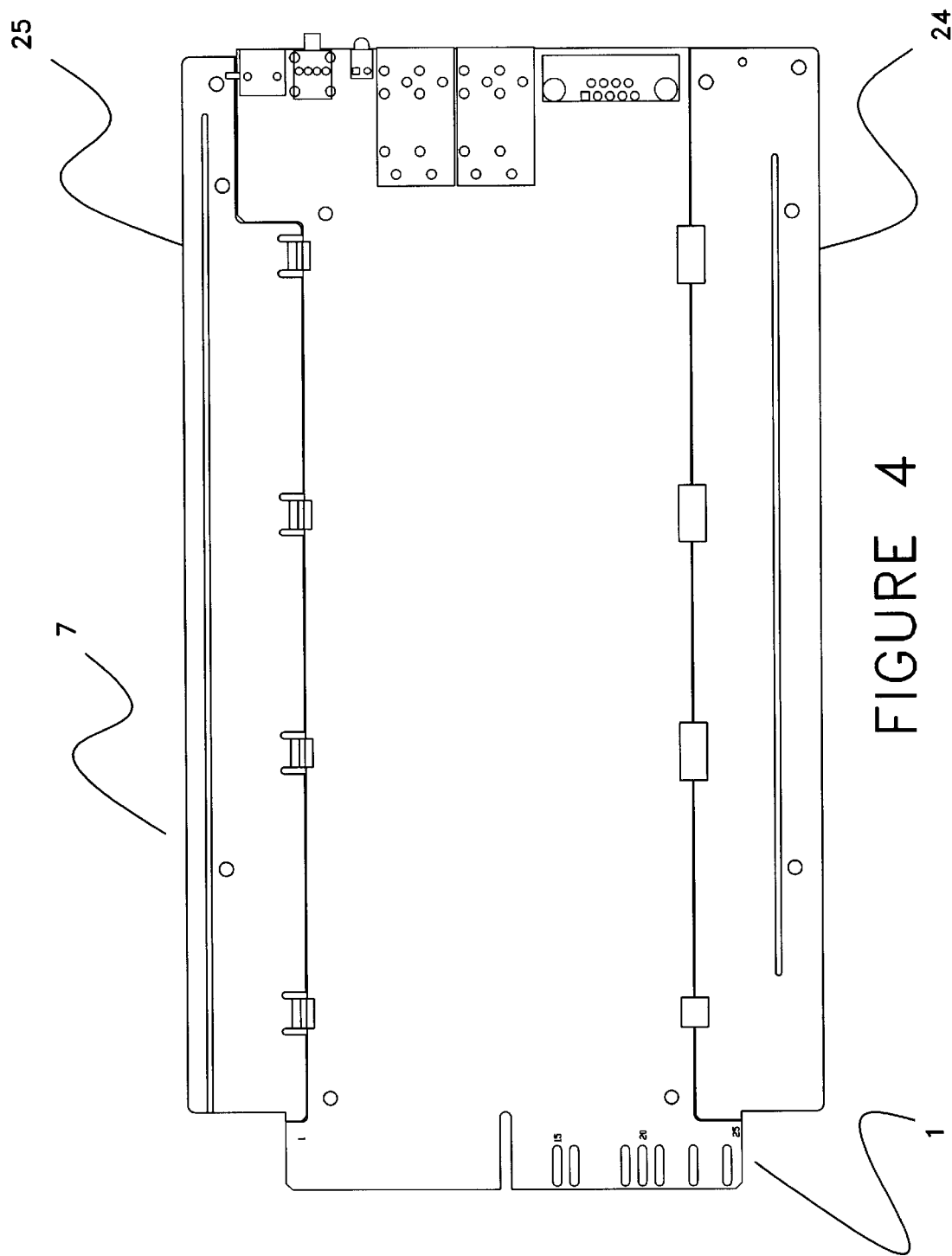
FIG. 4 is a side view of the adapter with a PCB installed.

FIG. 4 shows a PCB 1 mounted to the adapter 7. The edges 24 and 25 with their accurately fixed distance and orientation relative to each other due to the single piece design, locate the adapter into a PCB shelf.

What is claimed is:

1. An adapter for a printed circuit board having an upper edge and lower edge, comprising:

a recessed area in said adapter, defined by a first, lower horizontal strip of material where said lower edge of said printed circuit board rests and a second, upper horizontal strip of material located in the same plane and opposite said first strip to meet with said upper edge of said printed circuit board, said two horizontal strips connected by webs of material oriented perpendicular to and in a plane parallel and offset said first and second horizontal strips and functioning to define said recessed area, said area to contain and position said printed circuit board;

said lower, horizontal strip having cantilevered tabs along its inside edge and overhanging said recessed area;

said upper, horizontal strip having snap latches along its inside edge and overhanging said recessed area, said snap latches also functioning, in addition to being a latch, as a resting place for said upper edge of said printed circuit board;

said tabs and latches functioning to hold said printed circuit board within said recessed area.

2. The adapter of claim 1 comprising:

a single, molded plastic part, said cantilevered tabs and said flexible snap latches integrally molded along said edges of said horizontal strips.

* * * * *